US011906936B2

(12) United States Patent
Ochiai et al.

(10) Patent No.: US 11,906,936 B2
(45) Date of Patent: Feb. 20, 2024

(54) ELECTRONIC APPARATUS, POWER FEEDING CONTROL METHOD, AND NON-TRANSITORY RECORDING MEDIUM

(71) Applicant: CASIO COMPUTER CO., LTD., Tokyo (JP)

(72) Inventors: Fumiaki Ochiai, Higashiyamato (JP); Yoshinori Asami, Fussa (JP); Yohei Kawaguchi, Akishima (JP); Katsuhiko Obata, Fussa (JP)

(73) Assignee: CASIO COMPUTER CO., LTD., Tokyo (JP)

(*) Notice: Subject to any disclaimer, the term of this patent is extended or adjusted under 35 U.S.C. 154(b) by 92 days.

(21) Appl. No.: 17/382,790

(22) Filed: Jul. 22, 2021

(65) Prior Publication Data

US 2021/0351596 A1 Nov. 11, 2021

Related U.S. Application Data

(62) Division of application No. 16/278,523, filed on Feb. 18, 2019, now Pat. No. 11,108,258.

(30) Foreign Application Priority Data

Mar. 8, 2018 (JP) .................................. 2018-041898

(51) Int. Cl.
*G04G 19/06* (2006.01)
*H02J 7/00* (2006.01)
(Continued)

(52) U.S. Cl.
CPC ....... *G04G 19/06* (2013.01); *G01R 19/16542* (2013.01); *G01R 31/36* (2013.01);
(Continued)

(58) Field of Classification Search
CPC ........ H02J 7/0048; H02J 7/0071; H02J 7/007; H02J 7/007194; H02J 7/35; H01M 10/486;
(Continued)

(56) References Cited

U.S. PATENT DOCUMENTS 5,283,513 A 2/1994 Fujita et al.
2009/0184687 A1* 7/2009 Schroeder ............. H02J 7/0071
320/162
(Continued)

FOREIGN PATENT DOCUMENTS

JP 2012002767 A 1/2012
JP 2013181915 A 9/2013
(Continued)

OTHER PUBLICATIONS

Japanese Office Action dated Dec. 14, 2021 (and English translation thereof) issued in Japanese Application No. 2020-113761.

*Primary Examiner* — Edward Tso
*Assistant Examiner* — Aaron Piggush
(74) *Attorney, Agent, or Firm* — Holtz, Holtz & Volek PC

(57) ABSTRACT

An electronic apparatus includes a secondary battery, a first power feeder, a second power feeder, and a processor. The first power feeder feeds power to the secondary battery. The second power feeder feeds power to the secondary battery at a current larger than a current fed by the first power feeder. The processor selects an operation mode of the electronic apparatus based on different reference values selected based on whether the first power feeder is feeding power to the secondary battery or the second power feeder is feeding power to the secondary battery.

20 Claims, 13 Drawing Sheets

(51) Int. Cl.
*H01M 10/48* (2006.01)
*G01R 19/165* (2006.01)
*G01R 31/36* (2020.01)
*G04C 10/04* (2006.01)
*H02J 7/35* (2006.01)
*G01R 31/3842* (2019.01)

(52) U.S. Cl.
CPC .......... *G04C 10/04* (2013.01); *H01M 10/486* (2013.01); *H02J 7/007* (2013.01); *H02J 7/0048* (2020.01); *H02J 7/0071* (2020.01); *H02J 7/007194* (2020.01); *G01R 31/3842* (2019.01); *H02J 7/35* (2013.01)

(58) Field of Classification Search
CPC ................ G01R 31/36; G01R 31/3842; G01R 19/16542; G04C 10/04; G04G 19/06
USPC .......................... 320/125, 132, 134, 138, 152
See application file for complete search history.

(56) References Cited

U.S. PATENT DOCUMENTS

| | | | | |
|---|---|---|---|---|
| 2010/0217466 | A1* | 8/2010 | Ichikawa | B60L 58/24 701/22 |
| 2011/0260691 | A1* | 10/2011 | Ishibashi | B60L 58/15 320/134 |
| 2013/0207602 | A1* | 8/2013 | Fukaya | H02J 50/80 320/108 |
| 2017/0040812 | A1* | 2/2017 | Li | H02J 7/007182 |
| 2018/0131213 | A1* | 5/2018 | Nepote | H02J 7/16 |
| 2019/0058346 | A1* | 2/2019 | Lu | H02J 7/34 |

FOREIGN PATENT DOCUMENTS

| | | |
|---|---|---|
| JP | 2014167686 A | 9/2014 |
| JP | 2016119735 A | 6/2016 |

* cited by examiner

FIG.2A

FIRST CONVERSION TABLE (121)

| REMAINING BATTERY LEVEL \ TEMPERATURE | LOWER THAN -5°C | -5°C ~5°C | 5°C ~15°C | 15°C ~25°C | 25°C ~35°C | 35°C ~45°C | EQUAL TO OR HIGHER THAN 45°C |
|---|---|---|---|---|---|---|---|
| 7 | 3.85 | 3.85 | 3.85 | 3.85 | 3.85 | 3.85 | 3.85 |
| 6 | 3.73 | 3.73 | 3.72 | 3.71 | 3.71 | 3.70 | 3.69 |
| 5 | 3.70 | 3.69 | 3.68 | 3.67 | 3.66 | 3.65 | 3.64 |
| 4 | 3.60 | 3.59 | 3.58 | 3.57 | 3.56 | 3.55 | 3.54 |
| 3 | 3.2 | | | | | | |
| 2 | 2.1 | | | | | | |
| 1 | | | | | | | |

FIG.2B

SECOND CONVERSION TABLE (122)

| REMAINING BATTERY LEVEL \ TEMPERATURE | LOWER THAN -5°C | -5°C ~5°C | 5°C ~15°C | 15°C ~25°C | 25°C ~35°C | 35°C ~45°C | EQUAL TO OR HIGHER THAN 45°C |
|---|---|---|---|---|---|---|---|
| 7 | 3.92 | 3.92 | 3.92 | 3.92 | 3.92 | 3.92 | 3.92 |
| 6 | 3.80 | 3.79 | 3.79 | 3.78 | 3.77 | 3.77 | 3.76 |
| 5 | 3.77 | 3.76 | 3.75 | 3.74 | 3.73 | 3.72 | 3.71 |
| 4 | 3.67 | 3.66 | 3.65 | 3.64 | 3.63 | 3.62 | 3.61 |
| 3 | 2.8 | | | | | | |
| 2 | 2.1 | | | | | | |
| 1 | | | | | | | |

FIG.3

| REMAINING BATTERY LEVEL | OPERATION MODE | OPERATION DETAILS |
|---|---|---|
| 7 | M7 | ALL FUNCTIONS AVAILABLE |
| 6 | M6 | ALL FUNCTIONS AVAILABLE |
| 5 | M5 | ALL FUNCTIONS OTHER THAN GPS FUNCTION AVAILABLE |
| 4 | M4 | ALL FUNCTIONS OTHER THAN FUNCTION NEEDING HEAVY LOAD AVAILABLE |
| 3 | M3 | ALL FUNCTIONS OTHER THAN DISPLAYING CHARGING STATE UNAVAILABLE |
| 2 | M2 | ALL FUNCTIONS UNAVAILABLE |
| 1 | M1 | ALL FUNCTIONS UNAVAILABLE |

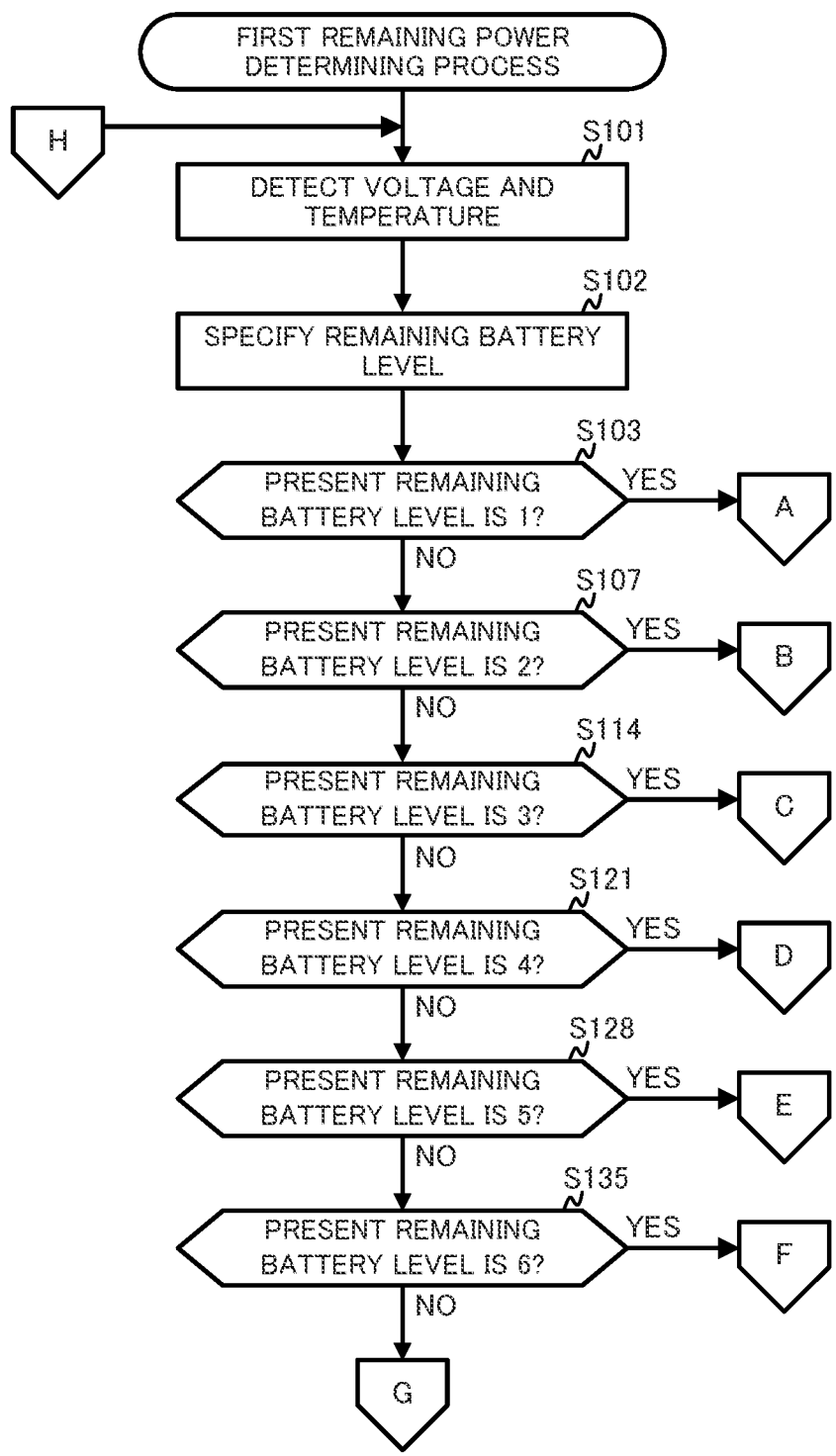

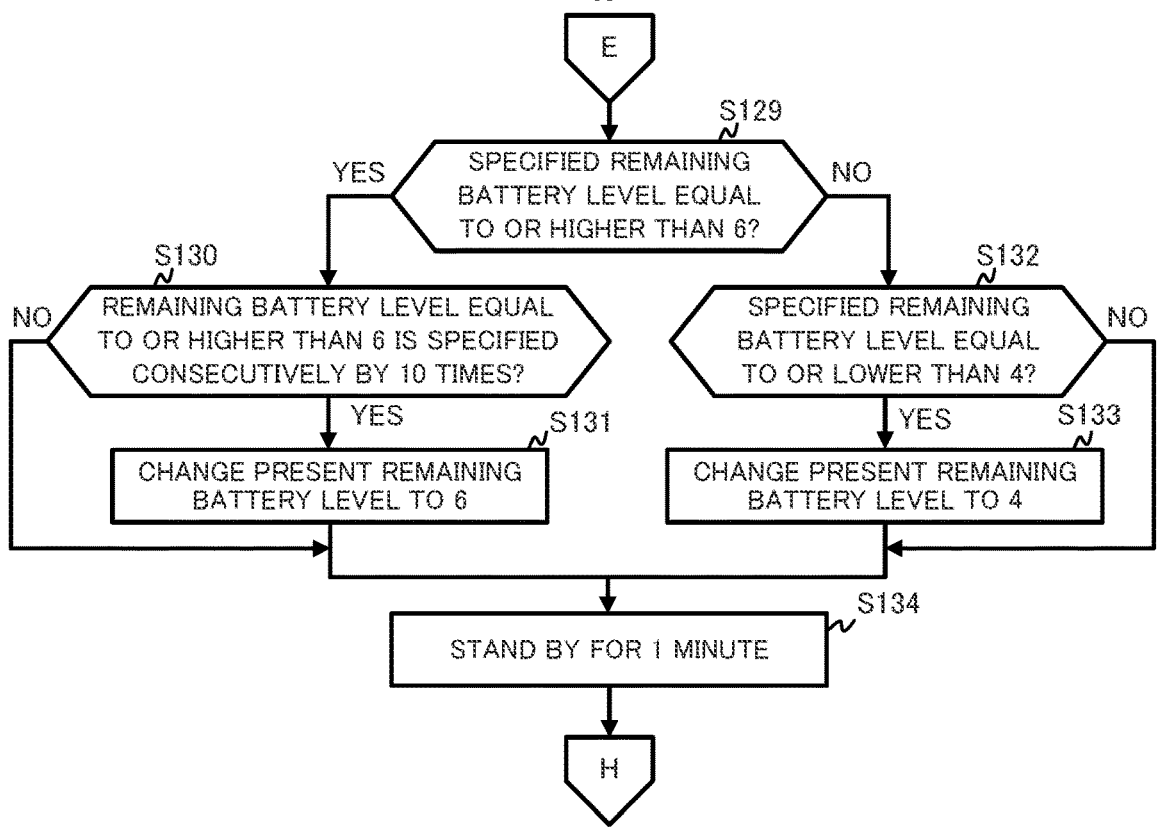
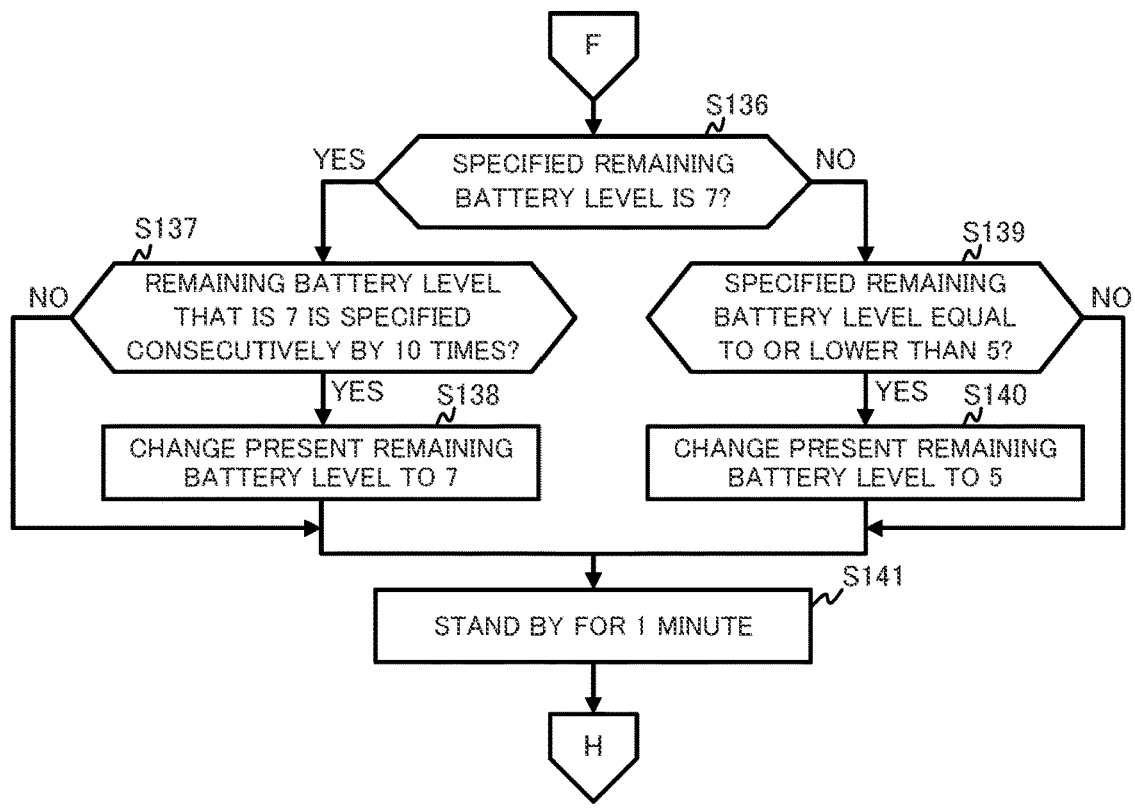

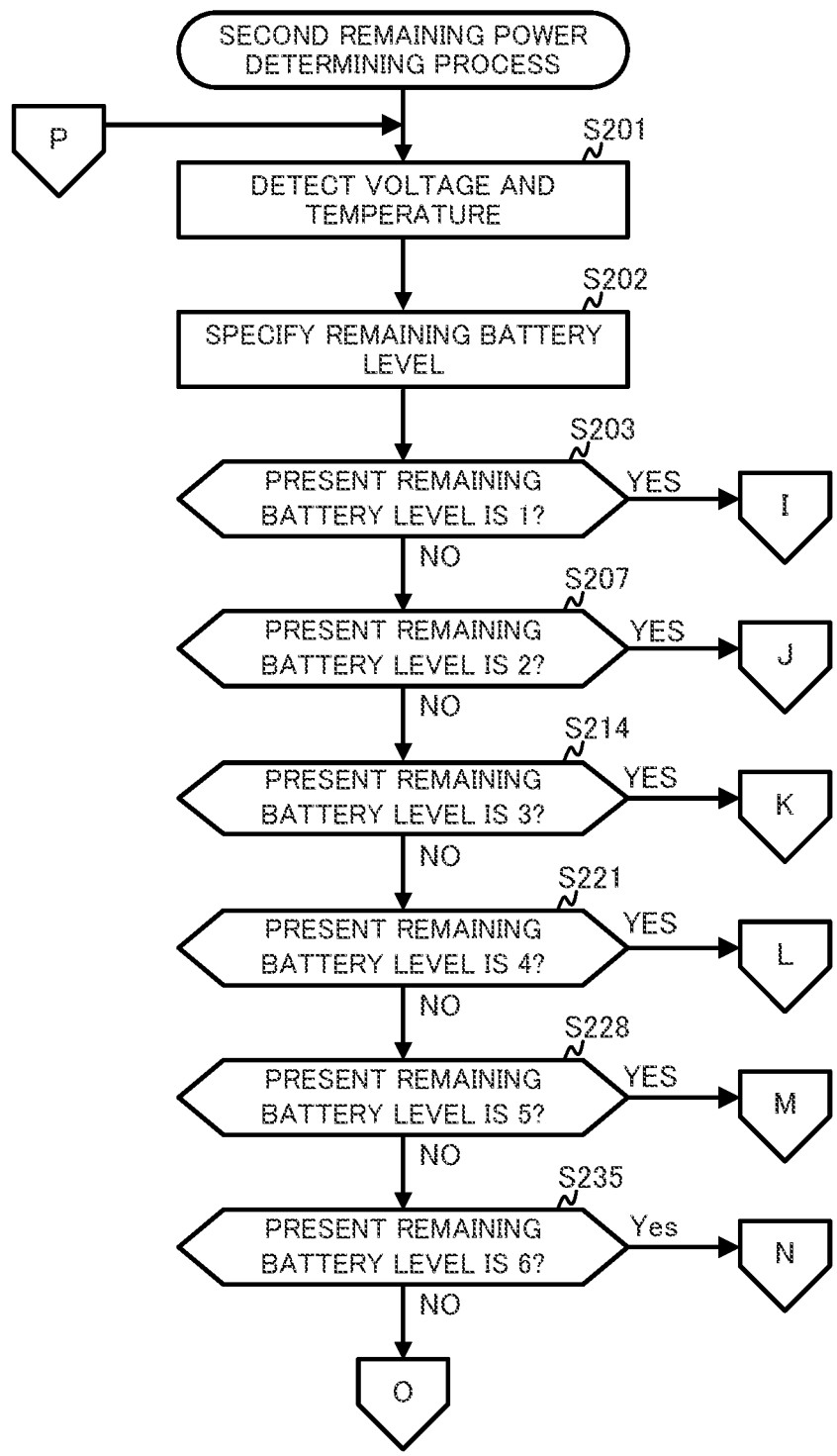

ELECTRONIC APPARATUS, POWER FEEDING CONTROL METHOD, AND NON-TRANSITORY RECORDING MEDIUM

CROSS-REFERENCE TO RELATED APPLICATION

This application is a Divisional Application of U.S. application Ser. No. 16/278,523, filed on Feb. 18, 2019, which claims the benefit of Japanese Patent Application No. 2018-041898, filed on Mar. 8, 2018, the entire disclosure of all of which are incorporated by reference herein.

FIELD

This application relates generally to an electronic apparatus, a power feeding control method, and a non-transitory recording medium.

BACKGROUND

Conventionally, for electronic timepieces, there is a technology that divides the remaining power of a secondary battery that stores power generated by solar cells into a plurality of stages, and sets an operation mode permitted in accordance with the stage (see, for example, Unexamined Japanese Patent Application Kokai Publication No. 2013-181915).

According to the electronic timepiece disclosed in the above-described Patent Literature, although only the solar cells are feeding power to the secondary battery, when an electronic apparatus is provided with, other than a power feeder that is the solar cells, a power feeder that feeds power from an external power supply connected by, for example, a Universal Serial Bus (USB) connection or a wireless connection to the secondary battery, and when a difference in currents flowing into the secondary battery from these power feeders increases, there is a possibility for an improper determination on the remaining power of the secondary battery.

SUMMARY

An electronic apparatus, a power feeding control method, and a non-transitory recording medium are disclosed herein.

A preferred embodiment provides an electronic apparatus including a secondary battery, a first power feeder, a second power feeder, and a processor. The first power feeder feeds power to the secondary battery. The second power feeder feeds power to the secondary battery at a current larger than a current fed from the first power feeder. The processor determines remaining power of the secondary battery based on different references. The references are a reference of when the first power feeder is feeding the power to the secondary battery and a reference of when the second power feeder is feeding the power to the secondary battery.

BRIEF DESCRIPTION OF THE DRAWINGS

A more complete understanding of this application can be obtained when the following detailed description is considered in conjunction with the following drawings, in which:

FIG. 2A is a diagram illustrating an example of data stored in a first conversion table according to an embodiment;

FIG. 2B is a diagram illustrating an example of data stored in a second conversion table according to an embodiment;

FIG. 3 is a diagram illustrating a correspondence relation between a remaining battery level and an operation mode according to an embodiment;

FIG. 4 is a flowchart illustrating a control procedure for a first remaining power determining process executed by a CPU of a microcomputer;

FIG. 7A is a flowchart illustrating a control procedure for the first remaining power determining process executed by the CPU of the microcomputer;

FIG. 7B is a flowchart illustrating a control procedure for the first remaining power determining process executed by the CPU of the microcomputer;

FIG. 9 is a flowchart illustrating a control procedure for a second remaining power determining process executed by a CPU of a microcomputer;

DETAILED DESCRIPTION

Figure 1:
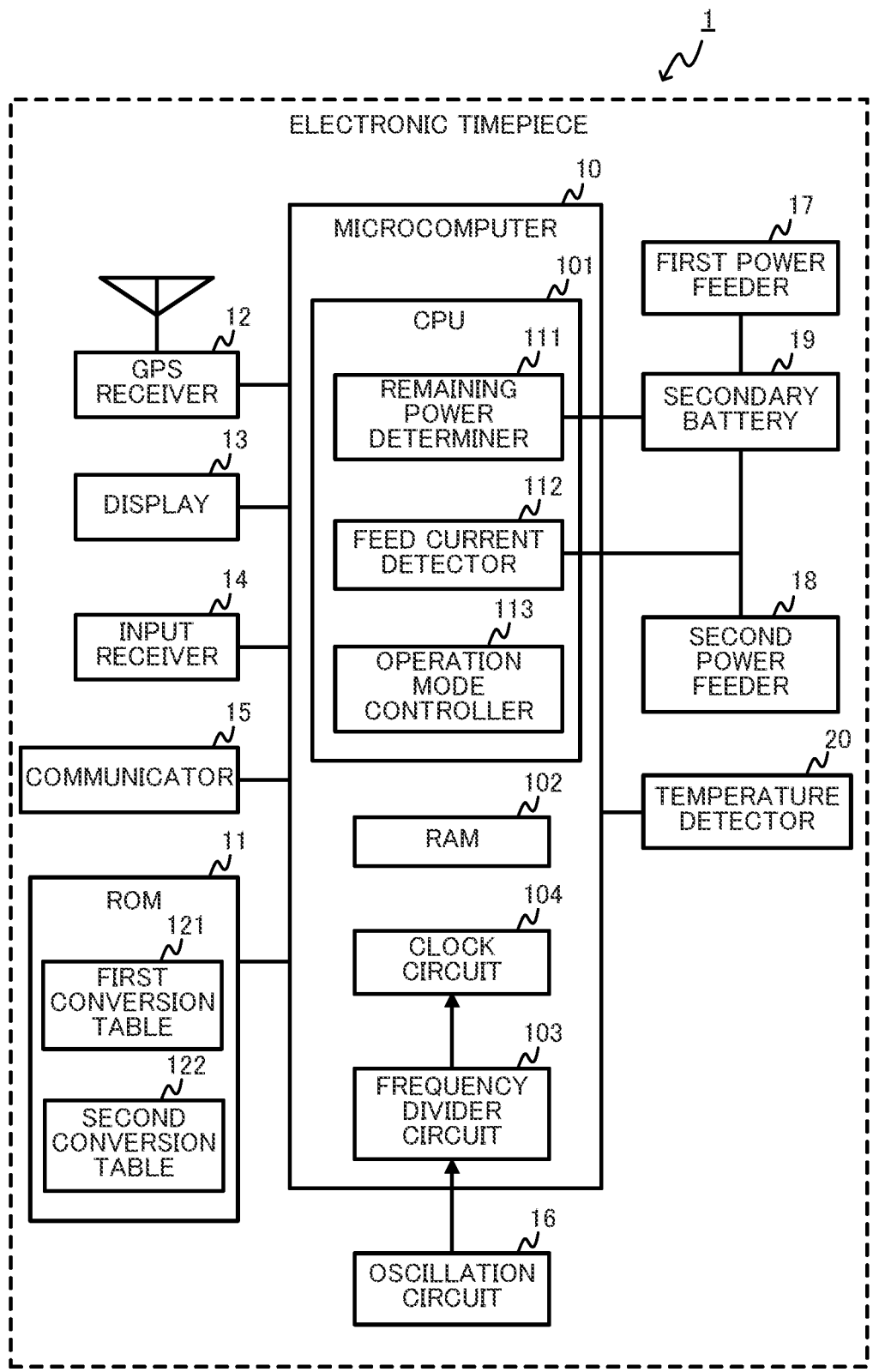
FIG. 1 is a diagram illustrating an example of a structure of an electronic timepiece according to an embodiment.

Embodiments will be described below with reference to the drawings. FIG. 1 is a diagram illustrating an example of a structure of an electronic timepiece 1 according to an embodiment. First of all, a hardware configuration of the electronic timepiece 1 according to this embodiment will be described. As illustrated in FIG. 1, the electronic timepiece 1 includes a microcomputer 10, a Read-Only Memory (ROM) 11, a Global Positioning System (GPS) receiver 12, a display 13, an input receiver 14, a communicator 15, an oscillation circuit 16, a first power feeder 17, a second power feeder 18, a secondary battery 19, and a temperature detector 20.

The microcomputer 10 includes a Central Processing Unit (CPU) 101 that is a processor, a Random Access Memory (RAM) 102, a frequency divider circuit 103, and a clock circuit 104. Note that the RAM 102, the frequency divider circuit 103, and the clock circuit 104 may be provided outside the microcomputer 10 instead of the interior of the microcomputer 10. Moreover, the ROM 11, the GPS receiver 12, the display 13, the input receiver 14, the communicator 15, the oscillation circuit 16, the first power feeder 17, the second power feeder 18, the secondary battery 19, and the temperature detector 20 may be provided outside the microcomputer 10 instead of the interior of the microcomputer 10.

The CPU 101 is a processor that performs various kinds of arithmetic processing, and comprehensively controls the entire operation of the electronic timepiece 1. The CPU 101 reads a control program from the ROM 11, loads the read program in the RAM 102, and executes various operation processes, such as an arithmetic control relating to various functions and a display control.

The RAM 102 is a volatile memory, such as a Static Random Access Memory (SRAM) or a Dynamic Random Access Memory (DRAM). The RAM 102 stores temporal data, and also stores various setting data and image data to be displayed on the display 13. In this embodiment, the image data represents, for example, a present clock time, a year, a month, a day, a day of week, the remaining power of the secondary battery 19, and a charging state of the secondary battery 19.

The oscillation circuit 16 oscillates an oscillator like a quartz oscillator, and generates and outputs a predetermined frequency signal (a clock signal).

The frequency divider circuit 103 divides the frequency signal input from the oscillation circuit 16 to a frequency signal to be utilized by the clock circuit 104 and the CPU 101, and outputs the signal having undergone the frequency division. The frequency of this output signal may be changed based on the setting by the CPU 101.

The clock circuit 104 counts the number of signals input from the frequency divider circuit 103, and adds the counted number to an initial value, thereby calculating the present clock time. Note that the clock circuit 104 may be achieved by software that changes a value stored in the RAM 102, or may be achieved by special-purpose hardware. The clock time kept by the clock circuit 104 may be any of an accumulated time from a predetermined timing, a Coordinated Universal Time (UTC), and a clock time (a local time) of a preset city. Moreover, the clock time kept by the clock circuit 104 may be in other formats than year, month, day, hour, minute, and second. Note that the oscillation circuit 16, the frequency divider circuit 103 and the clock circuit 104 form a clock in this embodiment.

The ROM 11 is, for example, a mask ROM or a rewritable non-volatile memory, and stores the control program and initial setting data. The control program contains programs relating to the control on the various processes to be described later. Moreover, the ROM 11 stores a first conversion table 121 and a second conversion table 122 to be described later.

The GPS receiver 12 is a module that receives and processes transmitted electromagnetic waves from a Global Positioning System (GPS) satellite via an antenna to obtain date and time information and positional information. In this embodiment, when, for example, the GPS receiver 12 obtains the date and time information, the CPU 101 corrects the clock time calculated by the clock circuit 104.

The display 13 displays the image data in response to an instruction from the CPU 101. In this embodiment, although the display 13 includes a liquid crystal panel that displays the clock time digitally, the present disclosure is not limited to this case. For example, the display 13 may include a second hand, a minute hand, an hour hand, and the like, and may display the analog clock time. Moreover, in addition to the second hand, the minute hand, the hour hand, and the like, the display 13 may also include the liquid crystal panel, indicate the analog clock time by the respective arms, and also display the data relating to the date and time and various functions.

The input receiver 14 receives an input operation given by a user, and outputs, to the microcomputer 10, an electric signal corresponding to the input operation. The input receiver 14 includes, for example, push button switches and a crown. Alternatively, the input receiver 14 that is a touch sensor may be provided so as to be laid over on the display screen of the display 13, and may form a touch panel together with the display screen. In this case, a touch sensor detects a touch position and a touch scheme relating to a touch operation by the user to the touch sensor, and outputs, to the microcomputer 10, an operation signal corresponding to the detected touch position and touch scheme.

The communicator 15 includes, for example, a Radio Frequency (RF) circuit, a BaseBand (BB) circuit, and a memory circuit. The communicator 15 transmits and receives wireless signals based on, for example, Bluetooth (registered trademark) Low Energy (BLE). Moreover, the communicator 15 demodulates, decodes, and the like, the received wireless signal, and outputs this signal to the microcomputer 10. Furthermore, the communicator 15 modulates, encodes, and the like, the signal transmitted from the microcomputer 10, and transmits this signal to the exterior.

The first power feeder 17 includes solar cells, and feeds, to the secondary battery 19, power generated by the solar cells that is receiving light. The greater the intensity of the light received by the solar cells is, the larger the power (a power feeding level) to be output by the first power feeder 17 becomes. In this case, it is assumed that, when the solar cells receives solar light (the light that has a lighting intensity equal to or greater than 10000 1x), the first power feeder 17 outputs a current that exceeds a reference current CR (for example, 50 μA). Note that the first power feeder 17 functions as first power feeding means.

The second power feeder 18 receives power supplied from an external device, and feeds the power to the secondary battery 19 by a larger current than that of the first power feeder 17. For example, the second power feeder 18 receives power supplied from an external wireless charging device by electromagnetic induction, and feeds the power to the secondary battery 19. When the electronic timepiece 1 is connected (set) to an external device (for example, a wireless charging device), in order to feed the power to the secondary battery 19, a voltage that is a power feeding voltage VS (for example, 5 V) is output from the second power feeder 18. Hence, when an output voltage V by the second power feeder 18 is compared with the reference voltage VR (a voltage between 0 V and VS, for example, 3 V), and when the output voltage V exceeds the reference voltage VR, the electronic timepiece 1 can determine as being connected (set) to the external device. Note that regarding the wireless charging device, the wireless charging scheme is not limited to electromagnetic induction. For example, a magnetic-field resonance scheme may be applied. Moreover, the charging scheme relating to the second power feeder 18 is not limited to the wireless charging, and for example, power may be fed from the external device via a cable like USB charging. Note that the second power feeder 18 functions as second power feeding means.

The secondary battery 19 is, for example, a lithium ion battery, and supplies the power to each component of the electronic timepiece 1. Moreover, the secondary battery 19 is charged by the power fed from the first power feeder 17 or from the second power feeder 18. Note that the first power feeder 17 may feed the power to the secondary battery 19 while the second power feeder 18 is feeding the power to the secondary battery 19.

The temperature detector 20 is a temperature sensor which detects the temperature of the secondary battery 19. The temperature detector 20 outputs a signal that indicates the detected temperature to the microcomputer 10.

Next, a functional configuration of the CPU 101 of the microcomputer 10 of the electronic timepiece 1 according to this embodiment will be described. As illustrated in FIG. 1, the CPU 101 functions as a remaining power determiner 111, a feed current detector 112, and an operation mode controller 113. Those functions as the remaining power determiner 111, the feed current detector 112, and the operation mode controller 113 may be achieved by the CPU 101, or may be achieved by a peripheral device or a special-purpose Integrated Circuit (IC) other than the CPU 101. Moreover, those functions may be achieved by a combination of the special-purpose IC with the CPU 101.

The CPU 101 as the remaining power determiner 111 determines the remaining power of the secondary battery 19 based on different references that are a reference of when the first power feeder 17 feeds the power to the secondary battery 19 and a reference of when the second power feeder 18 feeds the power to the secondary battery 19. More specifically, the CPU 101 detects the voltage of the secondary battery 19, and when the first power feeder 17 is feeding the power to the secondary battery 19, compares the detected voltage with a first reference to determine the remaining power of the secondary battery. Moreover, when the second power feeder 18 is feeding the power to the secondary battery 19, the CPU 101 compares the detected voltage with a second reference that is higher than the first reference to determine the remaining power of the secondary battery 19. In this case, "when the second power feeder 18 is feeding the power to the secondary battery 19" means a state in which the feed current from the second power feeder 18 to the secondary battery 19 is dominant with respect to the voltage increase in the secondary battery 19. When the first power feeder 17 is also feeding the power to the secondary battery 19 while the second power feeder 18 is feeding the power to the secondary battery 19, the current fed from the second power feeder 18 to the secondary battery 19 is larger than the current fed from the first power feeder 17 to the secondary battery 19, and thus the current fed from the second power feeder 18 to the secondary battery 19 is also dominant with respect to the voltage increase in the secondary battery 19. Accordingly, the state "when the second power feeder 18 is feeding the power to the secondary battery 19" also involves a case in which not only the second power feeder 18 but also the first power feeder 17 are feeding the power to the secondary battery 19. Note that the CPU 101 compares, for example, as described above, the output voltage V by the second power feeder 18 with the reference voltage VR, and when the output voltage V exceeds the reference voltage VR, determines that the electronic timepiece 1 is connected to the external device, and also determines that the second power feeder 18 is feeding the power to the secondary battery 19. Moreover, when the output voltage V does not exceed the reference voltage VR, the CPU 101 determines that the electronic timepiece 1 is not connected to the external device, and also determines that the first power feeder 17 is feeding the power to the secondary battery 19. Note that the remaining power determiner 111 functions as remaining power determining means.

More specifically, when the first power feeder 17 is feeding the power to the secondary battery 19, the CPU 101 compares the detected voltage of the secondary battery 19, and the temperature of the secondary battery 19 detected by the temperature detector 20 with a first reference predetermined in accordance with the temperature of the secondary battery 19, and determines the remaining power of the secondary battery 19. Moreover, when the second power feeder 18 is feeding the power to the secondary battery 19, the CPU 101 compares the detected voltage of the secondary battery 19, and the temperature of the secondary battery 19 with a second reference defined beforehand in accordance with the temperature of the detected secondary battery 19, and determines the remaining power of the secondary battery 19.

According to this embodiment, the CPU 101 utilizes, as the examples of the first reference and second reference, the first conversion table 121 and the second conversion table 122 which associate the voltage of the secondary battery 19, the temperature thereof, and the remaining battery level with each other. FIG. 2A and FIG. 2B illustrate an example of data stored in the first conversion table 121 and an example of data stored in the second conversion table 122, respectively. The first conversion table 121 and the second conversion table 122 illustrated in FIGS. 2A and 2B store, in association with a temperature range and with the remaining battery level, a lower limit voltage (V) of the secondary battery 19. In this case, the remaining battery level indicates the remaining power of the secondary battery 19 in a plurality of levels based on the voltage of the secondary battery 19. According to this embodiment, the remaining power of the secondary battery 19 is indicated by seven remaining battery levels from 1 to 7 in an order of the lower remaining power of the secondary battery 19. In general, since the voltage of the secondary battery 19 has temperature characteristics, in the first conversion table 121 and in the second conversion table, the higher the temperature is, the lower the lower limit voltage of the secondary battery 19 corresponding to each remaining battery level becomes. Moreover, since the current fed by the second power feeder 18 is larger than the current fed by the first power feeder 17, the higher voltage of the secondary battery 19 per a unit time is detected when the power is being fed by the second power feeder 18 in comparison with the power feeding by the first power feeder 17. Hence, even at the same remaining battery level, basically, the lower limit voltage in the second conversion table 122 is higher than the lower limit voltage in the first conversion table 121. However, as will be described later, when the remaining battery level for displaying a state that the secondary battery 19 is being charged in a corresponding operation mode that is 3, in order to promptly inform a user of the charging state during the power feeding by the second power feeder 18, the lower limit voltage corresponding to the remaining battery level 3 in the second conversion table 122 is set to be lower than the lower limit voltage corresponding to the remaining battery level 3 in the first conversion table 121.

According to this embodiment, the CPU 101 detects the voltage of the secondary battery 19 at a predetermined cycle (for example, per 1 minute), and the temperature of the secondary battery 19 by the temperature detector 20. Next, the CPU 101 refers to, when the first power feeder 17 is feeding the power to the secondary battery 19, the first conversion table 121 based on the detected voltage of the secondary battery 19 and the detected temperature of the secondary battery 19, and specifies the corresponding remaining battery level. Moreover, the CPU 101 refers to, when the second power feeder 18 is feeding the power to the secondary battery 19, the second conversion table 122 based on the detected voltage of the secondary battery 19 and the detected temperature of the secondary battery 19, and specifies the corresponding remaining battery level. The specified remaining battery level is recorded in the RAM 102 or the like. Next, the CPU 101 changes the present remaining battery level up by one when the remaining battery level higher than the present remaining battery level is specified consecutively a predetermined number of times corresponding to the present remaining battery level. Moreover, the CPU 101 changes the present remaining battery level down by one when the remaining battery level lower than the present remaining battery level is specified consecutively the predetermined number of times corresponding to the present remaining battery level.

When, for example, the present remaining battery level is 2, and the remaining battery level 3 is specified consecutively by three times, the CPU 101 changes the present remaining battery level from 2 to 3. Moreover, when the present remaining battery level is 4, and the remaining battery level 5 is specified consecutively by 30 times, the CPU 101 changes the present remaining battery level from 4 to 5.

Furthermore, according to this embodiment, the CPU 101 changes the predetermined number of times for specifying the present remaining battery level depending on whether the power is fed by the first power feeder 17 or the power is fed by the second power feeder 18. When, for example, during the power feeding by the first power feeder 17, the present remaining battery level is 4, and when the remaining battery level 5 is specified consecutively by 30 times, the CPU 101 changes the present remaining battery level from 4 to 5. In contrast, during the power feeding by the second power feeder 18, when the present remaining battery level is 4, and when the remaining battery level 5 is specified consecutively by three times, the CPU 101 changes the present remaining battery level from 4 to 5. That is, since the feed current of the second power feeder 18 is larger than the feed current of the first power feeder 17, the voltage increasing speed of the secondary battery is fast. Hence, the predetermined number of times is reduced in such a way that the remaining battery level increases faster by the power feeding from the second power feeder 18.

Moreover, according to this embodiment, the CPU 101 displays the determined remaining battery level on the display 13. Moreover, the CPU 101 displays, on the display 13, a state that the secondary battery 19 is being charged at the stage that is equal to or higher than the remaining battery level that is 3. Regarding this display scheme, an icon indicating the charging state may be displayed on the liquid crystal display of the display 13, or when the display 13 includes Light Emitting Diodes (LEDs), these LEDs may be turned on.

The CPU 101 as the feed current detector 112 detects a feed current flowing from the second power feeder 18 to the secondary battery 19. The CPU 101 determines whether or not the secondary battery 19 is fully charged based on the current value of the detected feed current. Typical secondary batteries are designed to cause the feed current to decrease as coming close to the full charge state. Hence, according to this embodiment, the CPU 101 determines that the secondary battery becomes a fully charge state when the feed current becomes equal to or smaller than a predetermined value (for example, 5 mA). Note that the CPU 101 may detect the feed current when the remaining battery level is 6, or may detect the feed current in other remaining battery levels.

The CPU 101 as the operation mode controller 113 controls the electronic timepiece 1 in accordance with the operation mode corresponding to the remaining battery level determined by the remaining power determiner 111. According to this embodiment, the CPU 101 controls the electronic timepiece 1 in the operation mode that is set so as to correspond to each remaining battery level as illustrated in, as an example, FIG. 3. In the example illustrated in FIG. 3, operation modes from M1 to M7 are set beforehand so as to correspond to remaining battery levels from 1 to 7. In each operation mode, the available function or the unavailable function in such an operation mode are set. For example, in the remaining battery level 4, the operation mode M4 is associated which can utilize all the functions other than the function that needs a heavy load, such as turning on of light, buzzers, various sensors, and BLE communications. The operation mode controller 113 specifies the operation mode corresponding to the present remaining battery level, and controls the operation of the electronic timepiece 1 in accordance with the available function and the unavailable function in such an operation mode. Such a correspondence relation between the remaining battery level and the operation mode is set beforehand in, for example, the ROM 11.

Next, an operation of the electronic timepiece 1 when the first power feeder 17 is feeding the power according to this embodiment will be described. FIG. 4, FIGS. 5A and 5B, FIGS. 6A and 6B, FIGS. 7A and 7B, and FIG. 8 are flowcharts illustrating a control procedure for a first remaining power determining process by the CPU 101 of the microcomputer 10 of the electronic timepiece 1 when the first power feeder 17 is feeding the power. When, for example, determining that the first power feeder 17 starts feeding the power, the CPU 101 executes the following processes.

First, in FIG. 4, the CPU 101 detects the temperature and voltage of the secondary battery 19 (step S101). Next, the CPU 101 refers to the first conversion table 121 stored in the ROM 11 based on the temperature and the voltage both detected in the step S101, and specifies the remaining battery level of the secondary battery 19 (step S102).

Figure 5A:
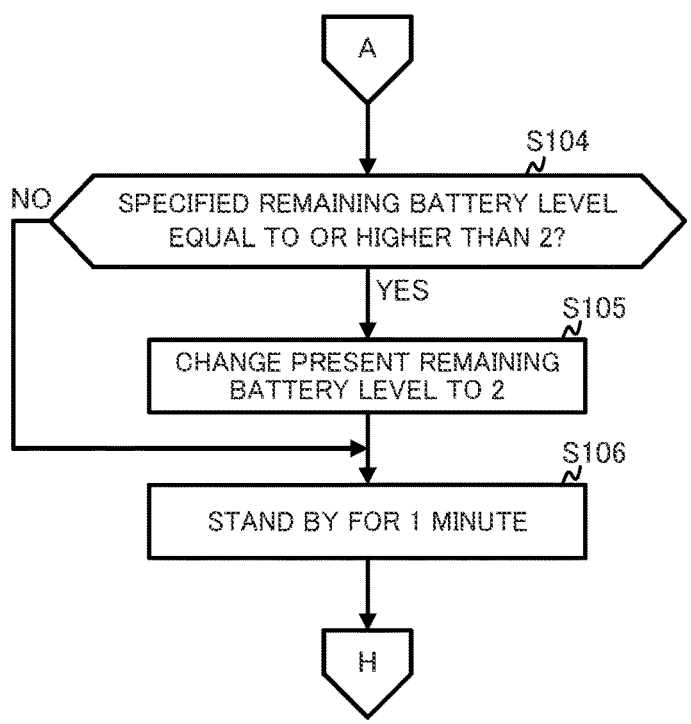
FIG. 5A is a flowchart illustrating a control procedure for the first remaining power determining process executed by the CPU of the microcomputer.

Next, the CPU 101 determines whether or not the present remaining battery level is 1 (step S103). When determining that the present remaining battery level is 1 (step S103: YES), the CPU 101 determines, as illustrated in FIG. 5A, whether or not the remaining battery level specified in the step S102 is equal to or higher than 2 (step S104).

When determining that the remaining battery level is equal to or higher than 2 (step S104: YES), the CPU 101 changes the present remaining battery level from 1 to 2 (step S105). When determining that the remaining battery level is not equal to or higher than 2 (step S104: NO), the CPU 101 progresses the process to step S106.

Next, the CPU 101 stands by for 1 minute (step S106), and returns the process to the step S101 illustrated in FIG. 4.

Figure 5B:
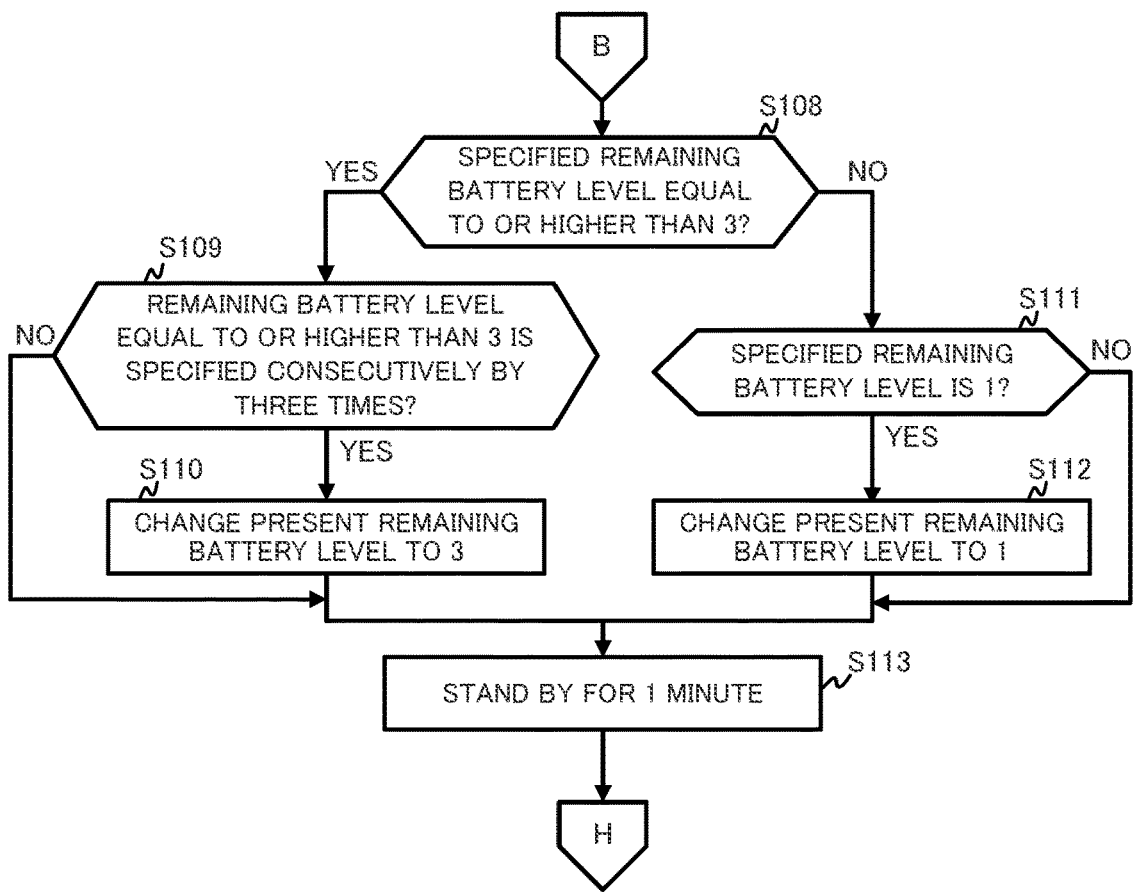
FIG. 5B is a flowchart illustrating a control procedure for the first remaining power determining process executed by the CPU of the microcomputer.

Returning to FIG. 4, when determining that the present remaining battery level is not 1 (step S103; NO), the CPU 101 determines whether or not the present remaining battery level is 2 (step S107). When determining that the present remaining battery level is 2 (step S107: YES), the CPU 101 determines, as illustrated in FIG. 5B, whether or not the remaining battery level specified in the step S102 is equal to or higher than 3 (step S108).

When determining that the remaining battery level is equal to or higher than 3 (step S108: YES), the CPU 101 determines whether or not remaining battery level that is equal to or higher than 3 is consecutively specified by three times (step S109). When determining that the remaining battery level that is equal to or higher than 3 is specified consecutively by three times (step S109: YES), the CPU 101 changes the present remaining battery level from 2 to 3 (step S110). When determining that the remaining battery level that is equal to or higher than 3 is not specified consecutively by three times (step S109: NO), the CPU 101 progresses the process to step S113.

When determining that the remaining battery level is not equal to or higher than 3 (step S108: NO), the CPU 101 determines whether or not the specified remaining battery level is 1 (step S111). When determining that the specified remaining battery level is 1 (step S111: YES), the CPU 101 changes the present remaining battery level from 2 to 1 (step S112). When determining that the specified remaining battery level is not 1 (step S111: NO), the CPU 101 progresses the process to the step S113.

Next, the CPU 101 stands by for 1 minute (step S113), and returns the process to the step S101 illustrated in FIG. 4.

Figure 6A:
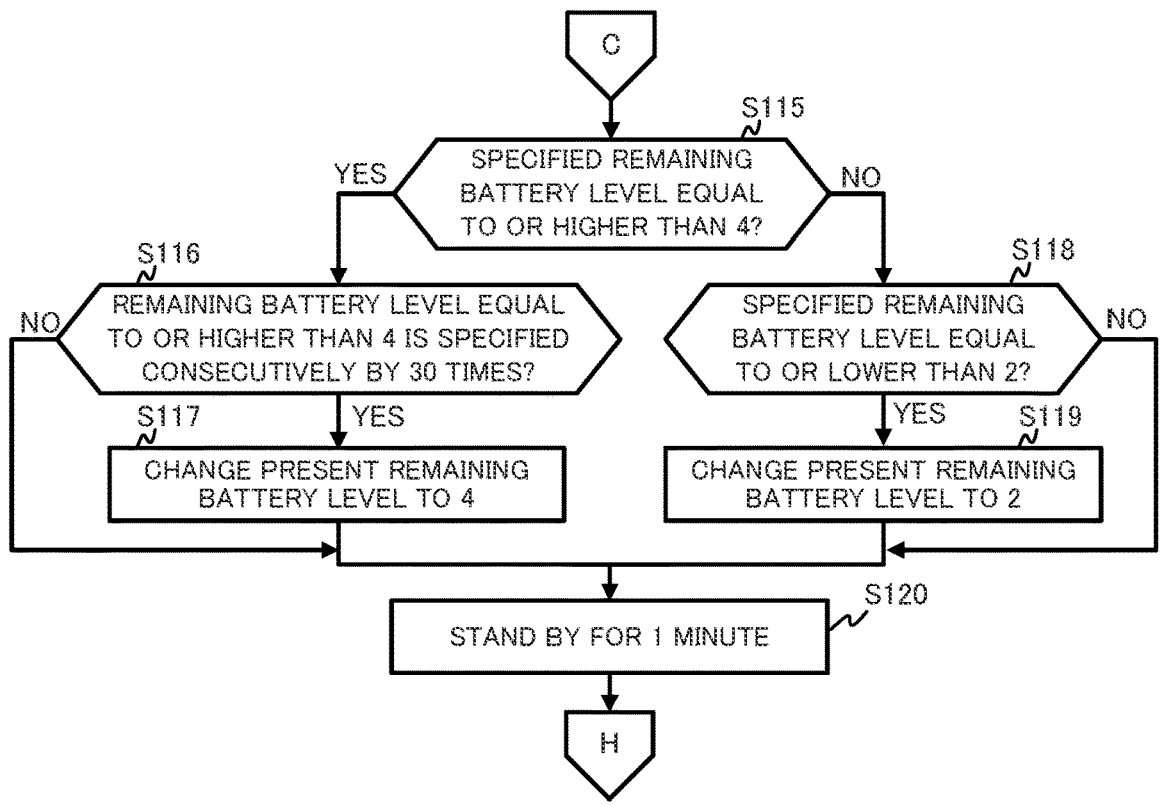
FIG. 6A is a flowchart illustrating a control procedure for the first remaining power determining process executed by the CPU of the microcomputer.

Returning to FIG. 4, when determining that the present remaining battery level is not 2 (step S107: NO), the CPU 101 determines whether or not the present remaining battery level is 3 (step S114). When determining that the present remaining battery level is 3 (step S114: YES), the CPU 101 determines, as illustrated in FIG. 6A, whether or not the remaining battery level specified in the step S102 is equal to or higher than 4 (step S115).

When determining that the remaining battery level is equal to or higher than 4 (step S115: YES), the CPU 101 determines whether or not the remaining battery level that is equal to or higher than 4 is specified consecutively by 30 times (step S116). When determining that the remaining battery level that is equal to or higher than 4 is specified consecutively by 30 times (step S116: YES), the CPU 101 changes the present remaining battery level from 3 to 4 (step S117). When determining that the remaining battery level that is equal to or higher than 3 is not specified consecutively by 30 times (step S116: NO), the CPU 101 progresses the process to step S120.

When determining that the remaining battery level is not equal to or higher than 4 (step S115: NO), the CPU 101 determines whether or not the specified remaining battery level is equal to or lower than 2 (step S118). When determining that the specified remaining battery level is equal to or lower than 2 (step S118: YES), the CPU 101 changes the present remaining battery level from 3 to 2 (step S119). When determining that the specified remaining battery level is not equal to or lower than 2 (step S118: NO), the CPU 101 progresses the process to step S120.

The CPU 101 stands by for 1 minute (step S120), and returns the process to the step S101 illustrated in FIG. 4.

Figure 6B:
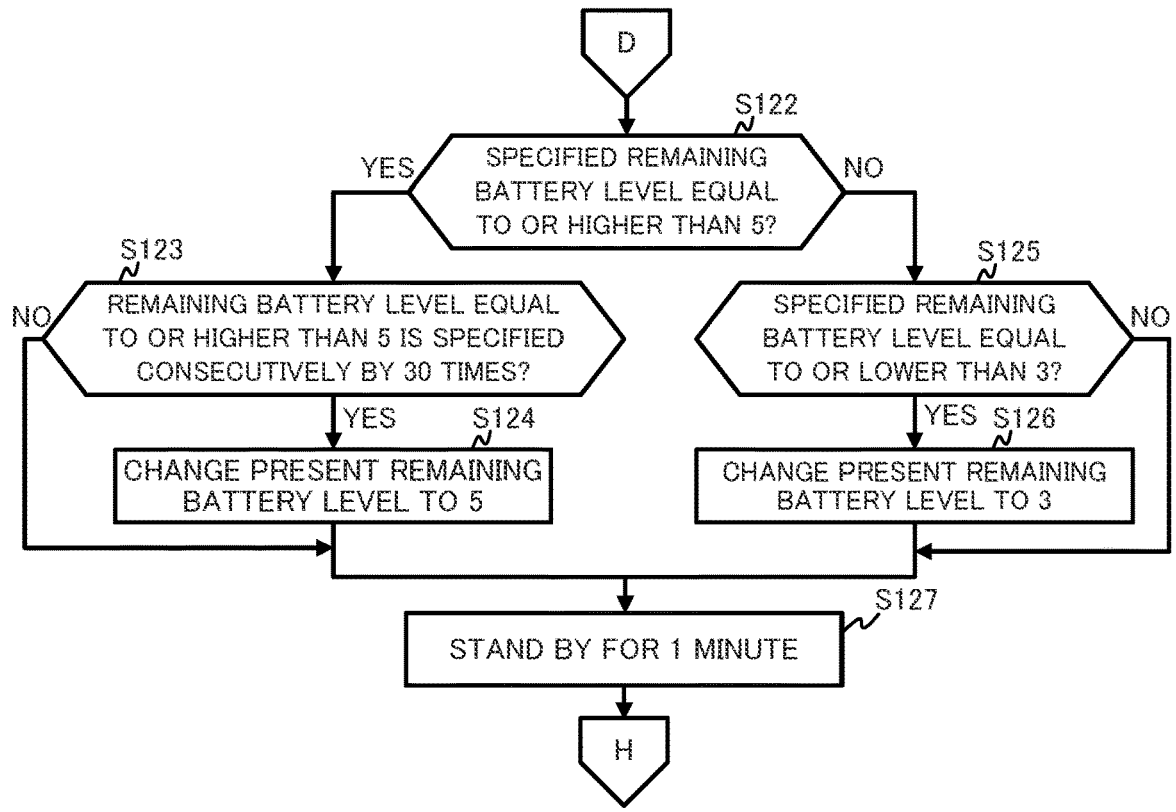
FIG. 6B is a flowchart illustrating a control procedure for the first remaining power determining process executed by the CPU of the microcomputer.

Returning to FIG. 4, when determining that the present remaining battery level is not 3 (step S114: NO), the CPU 101 determines whether or not the present remaining battery level is 4 (step S121). When determining that the present remaining battery level is 4 (step S121: YES), the CPU 101 determines, as illustrated in FIG. 6B, whether or not the remaining battery level specified in the step S102 is equal to or higher than 5 (step S122).

When determining that the remaining battery level is equal to or higher than 5 (step S122: YES), the CPU 101 determines whether or not the remaining battery level that is equal to or higher than 5 is specified consecutively by 30 times (step S123). When determining that the remaining battery level that is equal to or higher than 5 is specified consecutively by 30 times (step S123: YES), the CPU 101 changes the present remaining battery level from 4 to 5 (step S124). When determining that the remaining battery level that is equal to or higher than 5 is not specified consecutively by 30 times (step S123: NO), the CPU 101 progresses the process to step S127.

When determining that the remaining battery level is not equal to or higher than 5 (step S122: NO), the CPU 101 determines whether or not the specified remaining battery level is equal to or lower than 3 (step S125). When determining that the specified remaining battery level is equal to or lower than 3 (step S125: YES), the CPU 101 changes the present remaining battery level from 4 to 3 (step S126). When determining that the specified remaining battery level is not equal to or lower than 3 (step S125: NO), the CPU 101 progresses the process to step S127.

Next, the CPU 101 stands by for 1 minute (step S127), and returns the process to the step S101 illustrated in FIG. 4.

Returning to FIG. 4, when determining that the present remaining battery level is not 4 (step S121: NO), the CPU 101 determines whether or not the present remaining battery level is 5 (step S128). When determining that the present remaining battery level is 5 (step S128: YES), the CPU 101 determines, as illustrated in FIG. 7A, whether or not the remaining battery level specified in the step S102 is equal to or higher than 6 (step S129).

When determining that the remaining battery level is equal to or higher than 6 (step S129: YES), the CPU 101 determines whether or not the remaining battery level that is equal to or higher than 6 is specified consecutively by 10 times (step S130). When determining that the remaining battery level that is equal to or higher than 6 is specified consecutively by 10 times (step S130: YES), the CPU 101 changes the present remaining battery level from 5 to 6 (step S131). When determining that the remaining battery level that is equal to or higher than 6 is not specified consecutively by 10 times (step S130: NO), the CPU 101 progresses the process to step S134.

When determining that the remaining battery level is not equal to or higher than 6 (step S129: NO), the CPU 101 determines whether or not the specified remaining battery level is equal to or lower than 4 (step S132). When determining that the specified remaining battery level is equal to or lower than 4 (step S132: YES), the CPU 101 changes the present remaining battery level from 5 to 4 (step S133). When determining that the specified remaining battery level is not equal to or lower than 4 (step S132: NO), the CPU 101 progresses the process to step S134.

Next, the CPU 101 stands by for 1 minute (step S134), and returns the process to step S101 illustrated in FIG. 4.

Returning to FIG. 4, when determining that the present remaining battery level is not 5 (step S128: NO), the CPU 101 determines whether or not the present remaining battery level is 6 (step S135). When determining that the present remaining battery level is 6 (step S135: YES), the CPU 101 determines, as illustrated in FIG. 7B, whether or not the remaining battery level specified in the step S102 is 7 (step S136).

When determining that the remaining battery level is 7 (step S136: YES), the CPU 101 determines whether or not the remaining battery level that is 7 is specified consecutively by 10 times (step S137). When determining that the remaining battery level that is 7 is specified consecutively by 10 times (step S137: YES), the CPU 101 changes the present remaining battery level from 6 to 7 (step S138). When determining that the remaining battery level that is 7 is not specified consecutively by 10 times (step S137: NO), the CPU 101 progresses the process to step S141.

When determining that the remaining battery level is not 7 (step S136: NO), the CPU 101 determines whether or not the specified remaining battery level is equal to or lower than 5 (step S139). When determining that the specified remaining battery level is equal to or lower than 5 (step S139: YES), the CPU 101 changes the present remaining battery level from 6 to 5 (step S140). When determining that the specified remaining battery level is not equal to or lower than 5 (step S139: NO), the CPU 101 progresses the process to step S141.

Next, the CPU 101 stands by for 1 minute (step S141), and returns the process to the step S101 illustrated in FIG. 4.

Figure 8:
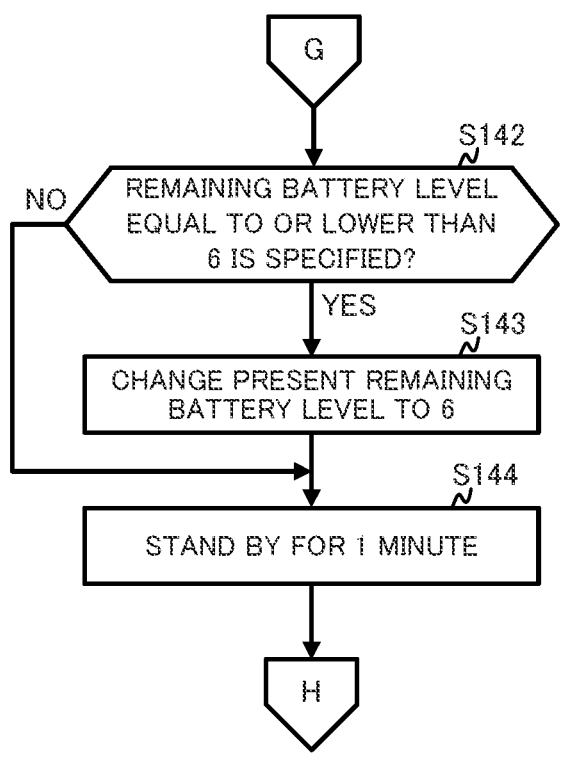
FIG. 8 is a flowchart illustrating a control procedure for the first remaining power determining process executed by the CPU of the microcomputer.

Returning to FIG. 4, when determining that the present remaining battery level is not 6 (step S135: NO), the CPU 101 determines that the present remaining battery level is 7, and determines, as illustrated in FIG. 8, whether or not the remaining battery level specified in the step S102 is equal to or lower than 6 (step S142). When determining that the specified remaining battery level is equal to or lower than 6 (step S142: YES), the CPU 101 changes the present remaining battery level from 7 to 6 (step S143). When determining that the specified remaining battery level is not equal to or lower than 6 (step S142: NO), the CPU 101 progresses the process to step S144.

Next, the CPU 101 stands by for 1 minute (step S144), and returns the process to the step S101 illustrated in FIG. 4.

The CPU 101 repeatedly executes the respective processes in the steps S101 to S144 at a predetermined cycle (for example, 1 minute), and determines the remaining battery level.

Next, an operation of the electronic timepiece 1 when the second power feeder 18 is feeding the power according to this embodiment will be described. FIG. 9, FIGS. 10A and 10B, FIGS. 11A and 11B, FIGS. 12A and 12B, and FIG. 13 are flowcharts illustrating a control procedure for a second remaining power determining process executed by the CPU 101 of the microcomputer 10 of the electronic timepiece 1 when the second power feeder 18 is feeding the power. When, for example, determining that the second power feeder 18 starts feeding the power, the CPU 101 executes the following processes.

First, in FIG. 9, the CPU 101 detects the temperature of the secondary battery 19 and the voltage thereof (step S201). Next, the CPU 101 refers to the second conversion table 122 stored in the ROM 11 based on the detected temperature and voltage in the step S201, and specifies the remaining battery level of the secondary battery 19 (step S202).

Figure 10A:
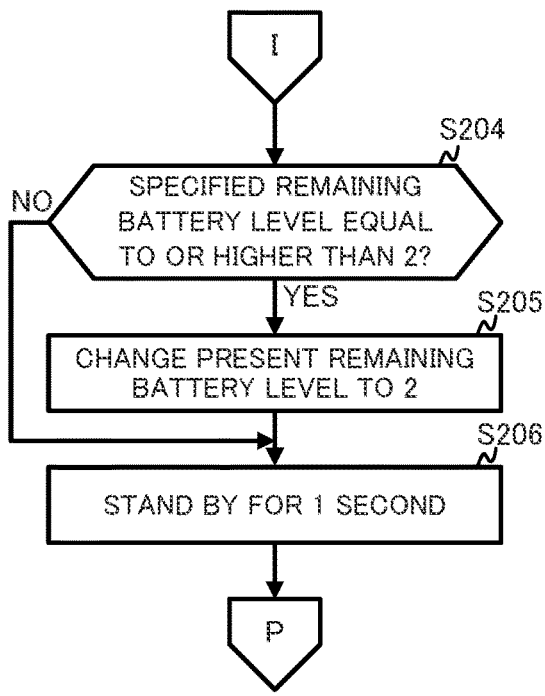
FIG. 10A is a flowchart illustrating a control procedure for the second remaining power determining process executed by the CPU of the microcomputer.

Next, the CPU 101 determines whether or not the present remaining battery level is 1 (step S203). When determining that the present remaining battery level is 1 (step S203: YES), the CPU 101 determines, as illustrated in FIG. 10A, whether or not the remaining battery level specified in the step S202 is equal to or higher than 2 (step S204).

When determining that the remaining battery level is equal to or higher than 2 (step S204: YES), the CPU 101 changes the present remaining battery level from 1 to 2 (step S205). When determining that the remaining battery level is not equal to or higher than 2 (step S204: NO), the CPU 101 progresses the process to step S206.

Next, the CPU 101 stands by for 1 second (step S206), and returns the process to the step S201 illustrated in FIG. 9.

Figure 10B:
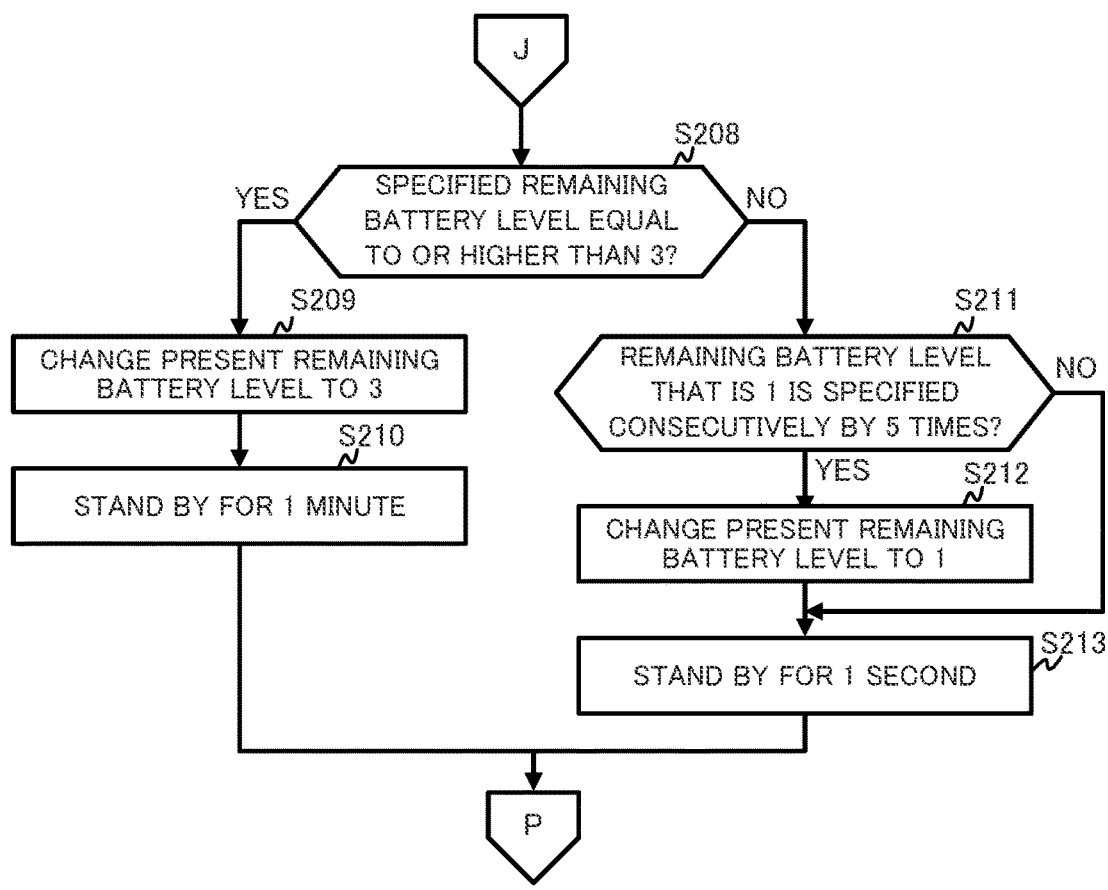
FIG. 10B is a flowchart illustrating a control procedure for the second remaining power determining process executed by the CPU of the microcomputer.

Returning to FIG. 9, when determining that the present remaining battery level is not 1 (step S203: NO), the CPU 101 determines whether or not the present remaining battery level is 2 (step S207). When determining that the present remaining battery level is 2 (step S207: YES), the CPU 101 determines, as illustrated in FIG. 10B, whether or not the remaining battery level specified in the step S202 is equal to or higher than 3 (step S208).

When determining that the remaining battery level is equal to or higher than 3 (step S208: YES), the CPU 101 changes the present remaining battery level from 2 to 3 (step S209). Next, the CPU 101 stands by for 1 minute (step S210), and returns the process to the step S201 illustrated in FIG. 9.

When determining that the remaining battery level is not equal to or higher than 3 (step S208: NO), the CPU 101 determines whether or not remaining battery level that is 1 is specified consecutively by 5 times (step S211). When determining that the remaining battery level that is 1 is specified consecutively by 5 times (step S211: YES), the CPU 101 changes the present remaining battery level from 2 to 1 (step S212). When determining that the remaining battery level that is 1 is not specified consecutively by 5 times (step S211: NO), the CPU 101 progresses the process to step S213. Next, the CPU 101 stands by for 1 second (step S213), and returns the process to the step S201 illustrated in FIG. 9.

Figure 11A:
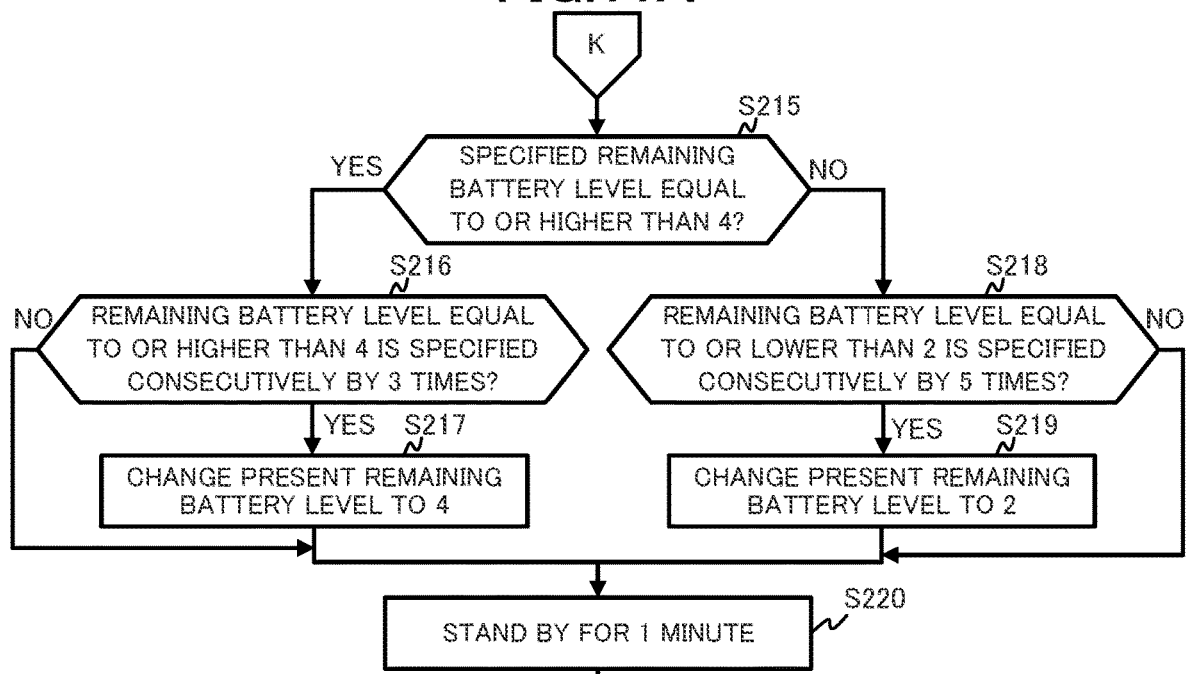
FIG. 11A is a flowchart illustrating a control procedure for the second remaining power determining process executed by the CPU of the microcomputer.

Returning to FIG. 9, when determining that the present remaining battery level is not 2 (step S207: NO), the CPU 101 determines whether or not the present remaining battery level is 3 (step S214). When determining that the present remaining battery level is 3 (step S214: YES), the CPU 101 determines, as illustrated in FIG. 11A, whether or not the remaining battery level specified in the step S202 is equal to or higher than 4 (step S215).

When determining that the remaining battery level is equal to or higher than 4 (step S215: YES), the CPU 101 determines whether or not the remaining battery level that is equal to or higher than 4 is specified consecutively by 3 times (step S216). When determining that the remaining battery level that is equal to or higher than 4 is specified consecutively by 3 times (step S216: YES), the CPU 101 changes the present remaining battery level from 3 to 4 (step S217). When determining that the remaining battery level that is equal to or higher than 4 is not specified consecutively by 3 times (step S216: NO), the CPU 101 progresses the process to step S220.

When determining that the remaining battery level is not equal to or higher than 4 (step S215: NO), the CPU 101 determines whether or not the remaining battery level that is equal to or lower than 2 is specified consecutively by 5 times (step S218). When determining that the remaining battery level that is equal to or lower than 2 is specified consecutively by 5 times (step S218: YES), the CPU 101 changes the present remaining battery level from 3 to 2 (step S219). When determining that the remaining battery level that is equal to or lower than 2 is not specified consecutively by 5 times (step S218: No), the CPU 101 progresses the process to step S220.

Next, the CPU 101 stands by for 1 minute (step S220), and returns the process to the step S201 illustrated in FIG. 9.

Figure 11B:
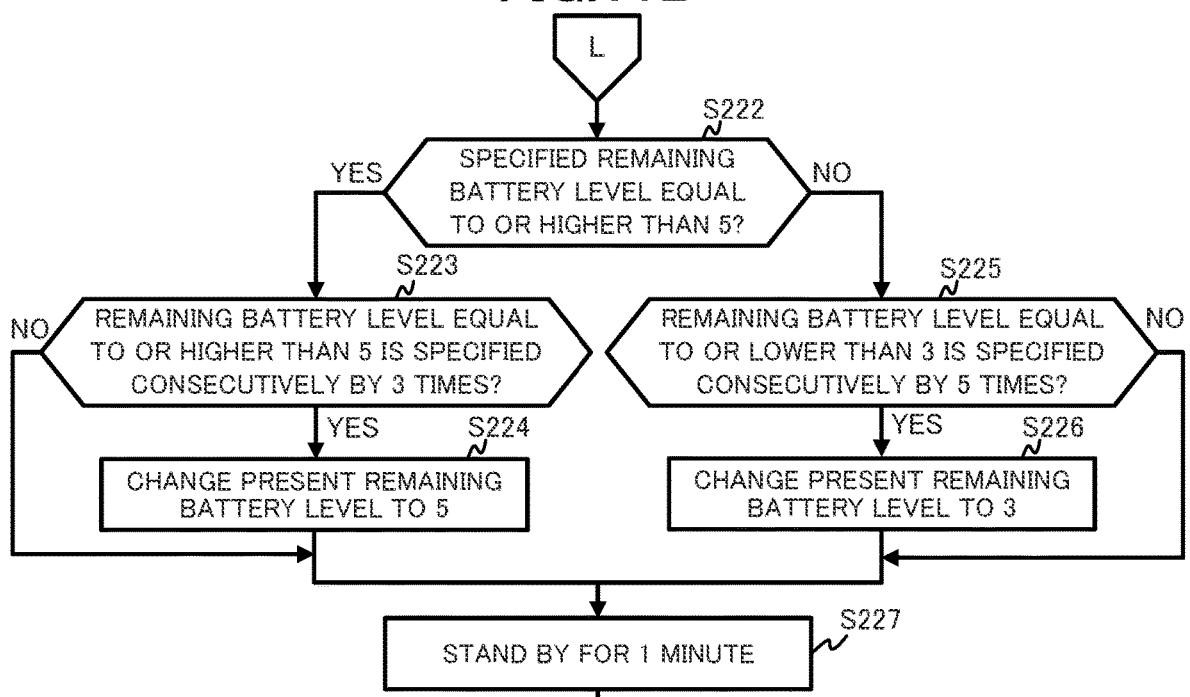
FIG. 11B is a flowchart illustrating a control procedure for the second remaining power determining process executed by the CPU of the microcomputer.

Returning to FIG. 9, when determining that the present remaining battery level is not 3 (step S214: NO), the CPU 101 determines whether or not the present remaining battery level is 4 (step S221). When determining that the present remaining battery level is 4 (step S221: YES), the CPU 101 determines, as illustrated in FIG. 11B, whether or not the remaining battery level specified in the step S202 is equal to or higher than 5 (step S222).

When determining that the remaining battery level is equal to or higher than 5 (step S222: YES), the CPU 101 determines whether or not the remaining battery level that is equal to or higher than 5 is specified consecutively by 3 times (step S223). When determining that the remaining battery level that is equal to or higher than 5 is specified consecutively by 3 times (step S223: YES), the CPU 101 changes the present remaining battery level from 4 to 5 (step S224). When determining that the remaining battery levels that is equal to or higher than 5 is not specified consecutively by 3 times (step S223: NO), the CPU 101 progresses the process to step S227.

When determining that the remaining battery level is not equal to or higher than 5 (step S222: NO), the CPU 101 determines whether or not the remaining battery level that is equal to or lower than 3 is specified consecutively by 5 times (step S225). When determining that the remaining battery level that is equal to or lower than 3 is specified consecutively by 5 times (step S225: YES), the CPU 101 changes the present remaining battery level from 4 to 3 (step S226). When determining that the remaining battery level that is equal to or lower than 3 is not specified consecutively by 5 times (step S225: NO), the CPU 101 progresses the process to step S227.

The CPU 101 stands by for 1 minute (step S227), and returns the process to the step S201 illustrated in FIG. 9.

Figure 12A:
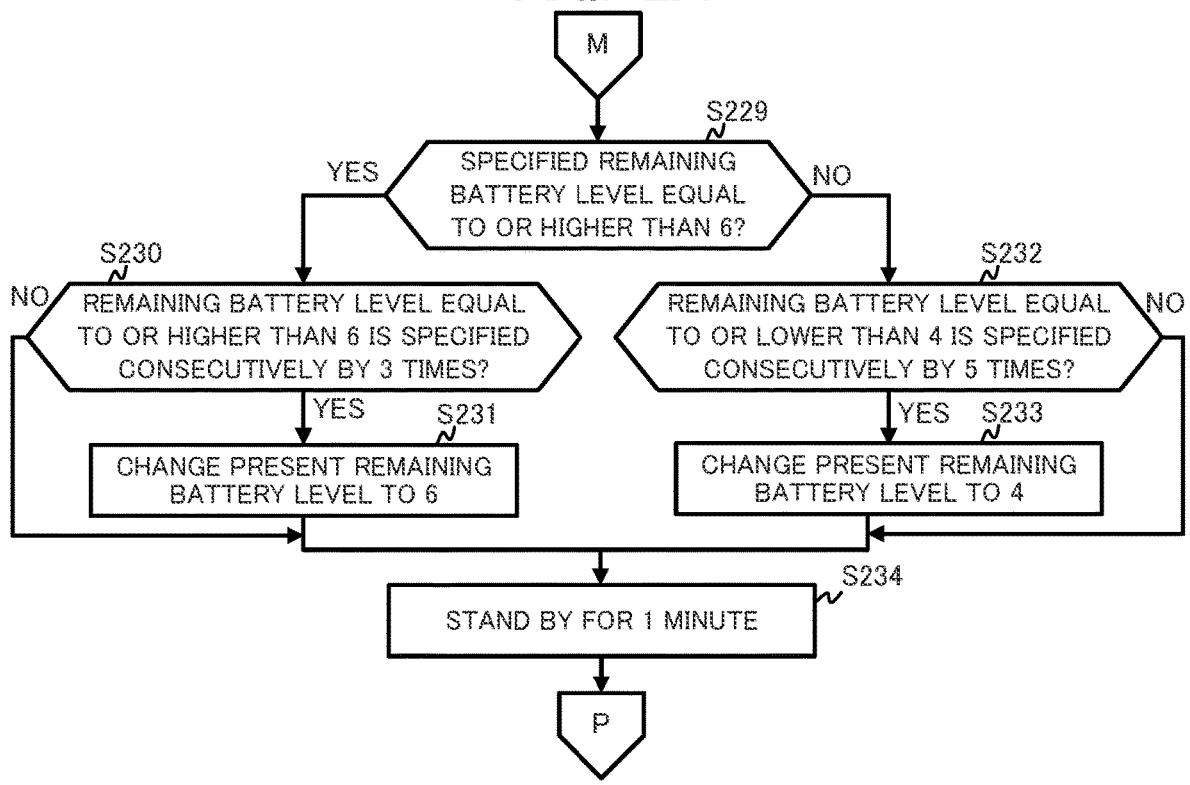
FIG. 12A is a flowchart illustrating a control procedure for the second remaining power determining process executed by the CPU of the microcomputer.

Returning to FIG. 9, when determining that the present remaining battery level is not 4 (step S221: NO), the CPU 101 determines whether or not the present remaining battery level is 5 (step S228). When determining that the present remaining battery level is 5 (step S228: YES), the CPU 101 determines, as illustrated in FIG. 12A, whether or not the remaining battery level specified in the step S202 is equal to or higher than 6 (step S229).

When determining that the remaining battery level is equal to or higher than 6 (step S229: YES), the CPU 101 determines whether or not the remaining battery level that is equal to or higher than 6 is specified consecutively by 3 times (step S230). When determining that the remaining battery level that is equal to or higher than 6 is specified consecutively by 3 times (step S230: YES), the CPU 101 changes the present remaining battery level from 5 to 6 (step S231). When determining that the remaining battery level that is equal to or higher than 6 is not specified consecutively by 3 times (step S230: NO), the CPU 101 progresses the process to step S234.

When determining that the remaining battery level is not equal to or higher than 6 (step S229: NO), the CPU 101 determines whether or not the remaining battery level that is equal to or lower than 4 is specified consecutively by 5 times (step S232). When determining that the remaining battery level that is equal to or lower than 4 is specified consecutively by 5 times (step S232: YES), the CPU 101 changes the present remaining battery level from 5 to 4 (step S233). When determining that the remaining battery level that is equal to or lower than 4 is specified consecutively by 5 times (step S232: NO), the CPU 101 progresses the process to step S234.

The CPU 101 stands by for 1 minute (step S234), and returns the process to the step S201 illustrated in FIG. 9.

Figure 12B:
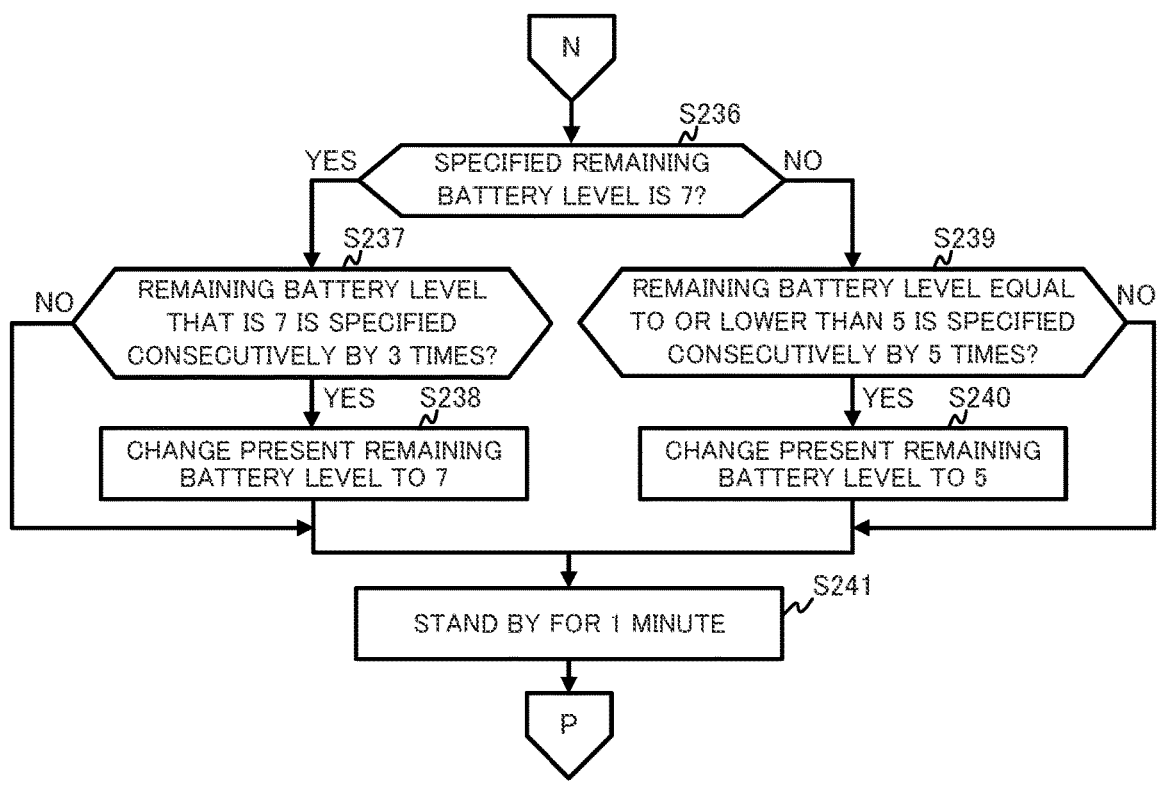
FIG. 12B is a flowchart illustrating a control procedure for the second remaining power determining process executed by the CPU of the microcomputer.

Returning to FIG. 9, when determining that the present remaining battery level is not 5 (step S228: NO), the CPU 101 determines whether or not the present remaining battery level is 6 (step S235). When determining that the present remaining battery level is 6 (step S235: YES), the CPU 101 determines, as illustrated in FIG. 12B, whether or not the remaining battery level specified in the step S202 is 7 (step S236).

When determining that the remaining battery level is 7 (step S236: YES), the CPU 101 determines whether or not the remaining battery level that is 7 is specified consecutively by 3 times (step S237). When determining that the remaining battery level that is 7 is specified consecutively by 3 times (step S237: YES), the CPU 101 changes the present remaining battery level from 6 to 7 (step S238). When determining that the remaining battery level that is 7 is not specified consecutively by 3 times (step S237: NO), the CPU 101 progresses the process to step S241.

When determining that the remaining battery level is not 7 (step S236: NO), the CPU 101 determines whether or not the remaining battery level that is equal to or lower than 5 is specified consecutively by 5 times (step S239). When determining that the remaining battery level that is equal to or lower than 5 is specified consecutively by 5 times (step S239: YES), the CPU 101 changes the present remaining battery level from 6 to 5 (step S240). When determining that the remaining battery level that is equal to or lower than 5 is not specified consecutively by 5 times (step S239: NO), the CPU 101 progresses the process to step S241.

Next, the CPU 101 stands by for 1 minute (step S241), and returns the process to the step S201 illustrated in FIG. 9.

Figure 13:
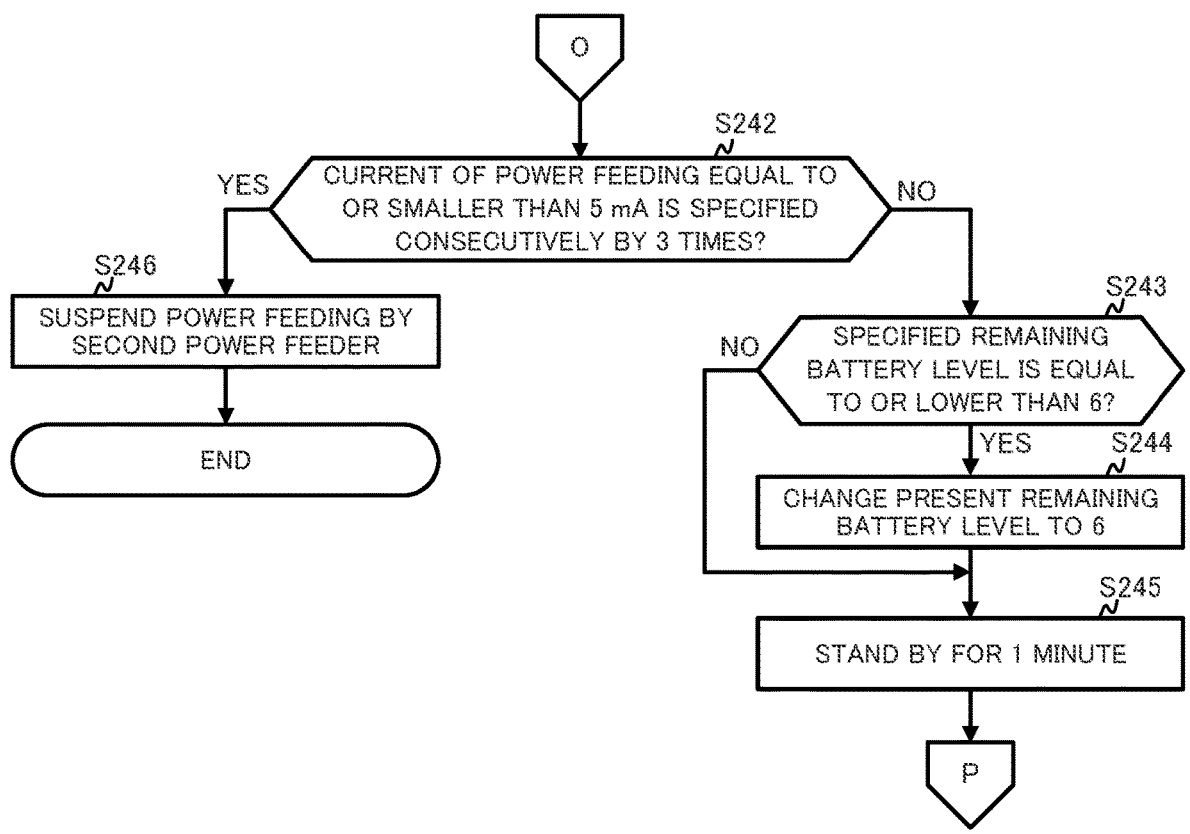
FIG. 13 is a flowchart illustrating a control procedure for the second remaining power determining process executed by the CPU of the microcomputer.

Returning to FIG. 9, when determining that the present remaining battery level is not 6 (step S235: NO), the CPU 101 determines that the present remaining battery level is 7, and determines, as illustrated in FIG. 13, whether or not the feed current that is equal to or smaller than 5 mA is detected consecutively by 3 times (step S242). When determining that the feed current that is equal to or smaller than 5 mA is detected consecutively by 3 times (step S242: YES), the CPU 101 suspends the power feeding by the second power feeder 18 (step S246), and completes this process.

When determining that the feed current that is equal to or smaller than 5 mA is not detected consecutively by 3 times (step S242: NO), the CPU 101 determines whether or not the specified remaining battery level is equal to or lower than 6 (step S243). When determining that the specified remaining battery level is equal to or lower than 6 (step S243: YES), the CPU 101 changes the present remaining battery level from 7 to 6 (step S244). When determining that the specified remaining battery level is not equal to or lower than 6 (step S243: NO), the CPU 101 progresses the process to step S245. Next, the CPU 101 stands by for 1 minute (step S245), and returns the process to the step S201 illustrated in FIG. 9.

Next, the CPU 101 repeatedly executes the respective processes in the steps S201 to S245 until the power feeding by the second power feeder 18 is suspended.

As described above, according to the electronic timepiece 1 of this embodiment, the CPU 101 determines the remaining power of the secondary battery 19 based on different references that are a reference of when the first power feeder 17 is feeding the power to the secondary battery 19 and a reference of when the second power feeder 18 that feeds the power to the secondary battery 19 at a current larger than that of the first power feeder 17 is feeding the power to the secondary battery 19. This enables a precise determination on the remaining power of the secondary battery 19 to which the power is fed from the equal to or greater than two power feeders.

Moreover, according to the electronic timepiece 1 of this embodiment, the CPU 101 compares, when the first power feeder 17 is feeding the power to the secondary battery 19, the detected voltage of the secondary battery 19 with the first reference to determine the remaining power of the secondary battery 19, and compares, when the second power feeder 18 is feeding the power to the secondary battery 19, the detected voltage of the secondary battery 19 with the second reference that is higher than the first reference to determine the remaining power of the secondary battery 19. As described above, by applying the higher reference than that of the first power feeder 17 for the second power feeder 18 that has a feed current larger than that of the first power feeder 17, the remaining power of the secondary battery 19 is precisely determinable.

Furthermore, according to the electronic timepiece 1 of this embodiment, the CPU 101 compares, when the first power feeder 17 is feeding the power to the secondary battery 19, the detected voltage of the secondary battery 19 and the temperature of the secondary battery 19 detected by the temperature detector 20 with the first reference that is defined beforehand in accordance with the temperature of the secondary battery 19 to determine the remaining power of the secondary battery 19, and compares, when the second power feeder 18 is feeding the power to the secondary battery 19, the detected voltage of the secondary battery 19 and the detected temperature of the secondary battery 19 with the second reference that is defined beforehand in accordance with the temperature of the secondary battery 19 to determine the remaining power of the secondary battery 19. This enables a precise determination on the remaining power of the secondary battery 19 with the temperature characteristics of the secondary battery 19 being taken into consideration.

Still further, according to the electronic timepiece 1 of this embodiment, the CPU 101 changes the present remaining battery level up by one when the remaining battery level higher than the present remaining battery level is specified consecutively the first predetermined number of times when the first power feeder 17 is feeding the power to the secondary battery 19, and changes the present remaining battery level up by one when the remaining battery level higher than the present remaining battery level is specified consecutively the second predetermined number of times that is smaller than the first predetermined number of times when the second power feeder 18 is feeding the power to the secondary battery 19. The number of consecutive specifying times for changing the remaining battery level up by one for the second power feeder 18 that feeds the power at a feed current larger than that of the first power feeder 17 is thus set smaller than that for the first feeder 17, thereby enabling specifying of the remaining battery level in accordance with the speed of the power feeding by the second power feeder 18.

Yet still further, according to the electronic timepiece 1 of this embodiment, the CPU 101 suspends the power feeding from the second power feeder 18 to the secondary battery 19 when the determined remaining power is a predetermined amount and when the feed current flowing from the second power feeder 18 to the secondary battery 19 is equal to or smaller than a predetermined value. This enables the CPU 101 to specify the fully charged state of the secondary battery 19, thereby suppressing a deterioration of the secondary battery 19 due to the continuation of the power feeding in the fully charged state and waste power consumption.

Moreover, according to the electronic timepiece 1 of this embodiment, the CPU 101 displays information indicating that the secondary battery 19 is being charged on the display 13 when the first power feeder 17 is feeding the power to the secondary battery 19 and when the detected voltage of the secondary battery 19 is within the first range that corresponds to the remaining battery level that is 3. Moreover, when the detected voltage of the secondary battery 19 is within the second range that has a lower limit lower than that of the first range and that corresponds to the remaining battery level that is 3 in a case where the second power feeder 18 is feeding the power to the secondary battery 19, the CPU displays, on the display 13, information indicating that the secondary battery is being charged. As described above, regarding the remaining battery level that is 3 at which information indicating that the secondary battery 19 is being charged is displayed, the lower limit corresponding to the remaining battery level 3 while the second power feeder 18 is feeding the power is lower than the lower limit corresponding to the remaining battery level 3 while the first power feeder 17 is feeding the power, enabling a prompt notification that the secondary battery is being charged to the user while the second power feeder 18 is feeding the power.

Note that the present disclosure is not limited to the above embodiment, and various changes can be made thereto.

For example, although the electronic timepiece 1 has been described as an example of the electronic apparatus that includes the secondary battery 19 to which the power is fed from the first power feeder 17 and from the second power feeder 18 in the above-described embodiment, the present disclosure is not limited to the electronic timepiece, and can be applied to any electronic apparatuses that include a plurality of power feeders that feed power to the secondary battery, such as a smart watch, a smart phone, a portable navigation system, and the like.

Moreover, in the above description, the ROM 11 that is a non-volatile memory like a flash memory has been described as an example of a computer-readable medium that stores the programs relating to the various processes of the present disclosure. However, the computer-readable medium is not limited to this example, and a portable non-transitory recording medium, such as a Hard Disk Drive (HDD), a Compact Disc Read Only Memory (CD-ROM), a Digital Versatile Disc (DVD) or the like, may be applied. Furthermore, carrier waves (carriers) are also applicable to the present disclosure as a medium that provides the data on the programs according to the present disclosure via a communication line.

Still further, the specific details of the structure, the control procedure, the display example, and the like, disclosed in the above-described embodiment can be modified as appropriate without departing from the scope and spirit of the present disclosure.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. An electronic apparatus comprising:
a secondary battery;
a first power feeder that feeds power to the secondary battery;
a second power feeder that feeds power to the secondary battery at a current larger than a current fed by the first power feeder; and
a processor configured to:
detect a voltage of the secondary battery;
in response to the first feeder feeding power to the secondary battery, select an operation mode from a plurality of operation modes based on a comparison of the detected voltage with a first reference value; and
in response to the second feeder feeding power to the secondary battery, select the operation mode from the plurality of operation modes based on a comparison of the detected voltage with a second reference value, the second reference value being different from the first reference value.

2. The electronic apparatus according to claim 1, wherein the processor is configured to:
in response to the first feeder feeding power to the secondary battery, select the operation mode from the plurality of operation modes based on a remaining power of the secondary battery as determined using the first reference value; and
in response to the second feeder feeding power to the secondary battery, select the operation mode from the plurality of operation modes based on a remaining power of the secondary battery as determined using the second reference value.

3. The electronic apparatus according to claim 1, wherein the processor is configured to:
in response to the first feeder feeding power to the secondary battery, determine a remaining power of the secondary battery by comparing the detected voltage with the first reference value, and select the operation mode from the plurality of operation modes based on the remaining power as determined using the first reference value; and
in response to the second feeder feeding power to the secondary battery, determine the remaining power of the secondary battery by comparing the detected voltage with the second reference value, and select the operation mode from the plurality of operation modes based on the remaining power as determined using the second reference value, the second reference value being higher than the first reference value.

4. The electronic apparatus according to claim 1, wherein:
the power fed by the first power feeder is power generated by solar cells, and
the power fed by the second power feeder is power supplied from an external charging device.

5. The electronic apparatus according to claim 4, wherein the external charging device comprises a wireless charging device or a wired charging device.

6. The electronic apparatus according to claim 1, wherein each of the first reference value and the second reference value is associated with one of plural predetermined secondary battery temperature ranges.

7. The electronic apparatus according to claim 1, wherein the operation mode limits a function of the electronic apparatus based on a remaining power of the secondary battery.

8. The electronic apparatus according to claim 1, wherein each of the plurality of operation modes is associated with an available function or an unavailable function of the electronic apparatus.

9. The electronic apparatus according to claim 1, wherein the processor is configured to, in response to the first feeder and the second feeder feeding power to the secondary battery, select the operation mode from the plurality of operation modes based on a comparison of the detected voltage with the second reference value.

10. A power feeding control method comprising:
detecting a voltage of a secondary battery;
in response to a first feeder feeding power to the secondary battery, selecting an operation mode from a plurality of operation modes based on a comparison of the detected voltage with a first reference value; and
in response to a second feeder feeding power to the secondary battery, selecting the operation mode from the plurality of operation modes based on a comparison of the detected voltage with a second reference value,
wherein the second reference value is different from the first reference value, and
wherein the second power feeder feeds power to the secondary battery at a current larger than a current fed by the first power feeder.

11. The method according to claim 10, further comprising:
in response to the first feeder feeding power to the secondary battery, selecting the operation mode from the plurality of operation modes based on a remaining power of the secondary battery as determined using the first reference value; and
in response to the second feeder feeding power to the secondary battery, selecting the operation mode from the plurality of operation modes based on a remaining power of the secondary battery as determined using the second reference value.

12. The method according to claim 10, further comprising:
in response to the first feeder feeding power to the secondary battery, determining a remaining power of the secondary battery by comparing the detected voltage with the first reference value, and selecting the operation mode from the plurality of operation modes based on the remaining power as determined using the first reference value; and
in response to the second feeder feeding power to the secondary battery, determining the remaining power of the secondary battery by comparing the detected voltage with the second reference value, and selecting the operation mode from the plurality of operation modes based on the remaining power as determined using the second reference value, the second reference value being higher than the first reference value.

13. The method according to claim 10, wherein:
the power fed by the first power feeder is power generated by solar cells, and
the power fed by the second power feeder is power supplied from an external charging device.

14. The method according to claim 13, wherein the external charging device comprises a wireless charging device or a wired charging device.

15. The method according to claim 10, wherein each of the first reference value and the second reference value is associated with one of plural predetermined secondary battery temperature ranges.

16. A non-transitory recording medium that stores a program executable by a computer of an electronic apparatus to control the computer to:
- detect a voltage of a secondary battery;
- in response to a first feeder feeding power to the secondary battery, select an operation mode from a plurality of operation modes based on a comparison of the detected voltage with a first reference value; and
- in response to a second feeder feeding power to the secondary battery, select the operation mode from the plurality of operation modes based on a comparison of the detected voltage with a second reference value,
- wherein the second reference value is different from the first reference value, and
- wherein the second power feeder feeds power to the secondary battery at a current larger than a current fed by the first power feeder.

17. The non-transitory recording medium according to claim 16, wherein the program further controls the computer to:
- in response to the first feeder feeding power to the secondary battery, select the operation mode from the plurality of operation modes based on a remaining power of the secondary battery as determined using the first reference value; and
- in response to the second feeder feeding power to the secondary battery, select the operation mode from the plurality of operation modes based on a remaining power of the secondary battery as determined using the second reference value.

18. The non-transitory recording medium according to claim 16, wherein the program further controls the computer to:
- in response to the first feeder feeding power to the secondary battery, determine a remaining power of the secondary battery by comparing the detected voltage with the first reference value, and select the operation mode from the plurality of operation modes based on the remaining power as determined using the first reference value; and
- in response to the second feeder feeding power to the secondary battery, determine the remaining power of the secondary battery by comparing the detected voltage with the second reference value, and select the operation mode from the plurality of operation modes based on the remaining power as determined using the second reference value, the second reference value being higher than the first reference value.

19. The non-transitory recording medium according to claim 16, wherein:
- the power fed by the first power feeder is power generated by solar cells,
- the power fed by the second power feeder is power supplied from an external charging device, and
- the external charging device comprises a wireless charging device or a wired charging device.

20. The non-transitory recording medium according to claim 16, wherein each of the first reference value and the second reference value is associated with one of plural predetermined secondary battery temperature ranges.

* * * * *